United States Patent [19]

Ariizumi et al.

[11] Patent Number: 4,535,426

[45] Date of Patent: Aug. 13, 1985

[54] SEMICONDUCTOR MEMORY DEVICE

[75] Inventors: Shoji Ariizumi; Makoto Segawa, both of Tokyo; Fujio Masuoka, Yokohama, all of Japan

[73] Assignee: Tokyo Shibaura Denki Kabushiki Kaisha, Japan

[21] Appl. No.: 504,157

[22] Filed: Jun. 14, 1983

[30] Foreign Application Priority Data

Jul. 19, 1982 [JP] Japan ................. 57-125344

[51] Int. Cl.³ .......................... G11C 11/40
[52] U.S. Cl. ..................... 365/182; 365/154
[58] Field of Search ............ 365/182, 174, 154

[56] References Cited

U.S. PATENT DOCUMENTS 4,480,319 10/1984 Hotta et al. ................. 365/155

OTHER PUBLICATIONS

Ishihara et al., "A 256K Dynamic MOS RAM with Alpha Immune and Redundancy," ISSCC Dig. Tech. Papers, pp. 74-75, Feb. 10, 1982.

Masuhara et al., "2Kx8b HCMOS Static RAMS," ISSCC Dig. Tech. Papers, pp. 224-225, Feb. 15, 1980.

Yoshimoto et al., pp. 2-217, (preprint), Whole National Meeting of Electronics and Communications Engineers of Japan, "Improvement of a 16K Static MOS RAM Soft Error".

Primary Examiner—Terrell W. Fears
Attorney, Agent, or Firm—Finnegan, Henderson, Farabow, Garrett & Dunner

[57] ABSTRACT

A memory device of the invention has a P type substrate, a first drain area of N type formed in the substrate, a second drain area of N type formed in the substrate close to the first drain area, and a source area of N+ type formed around the first and second drain areas so that the source area continuously surrounds the drain areas from three sides, e.g., the right, left and top sides of these areas. The combination of the closed arrangement of the drain areas and the surrounding arrangement of the source area decreases minority carriers generated around the drain areas and prevents unbalanced carrier absorption of the drain areas, thereby suppressing the occurrence of a soft error.

34 Claims, 44 Drawing Figures

NORMAL

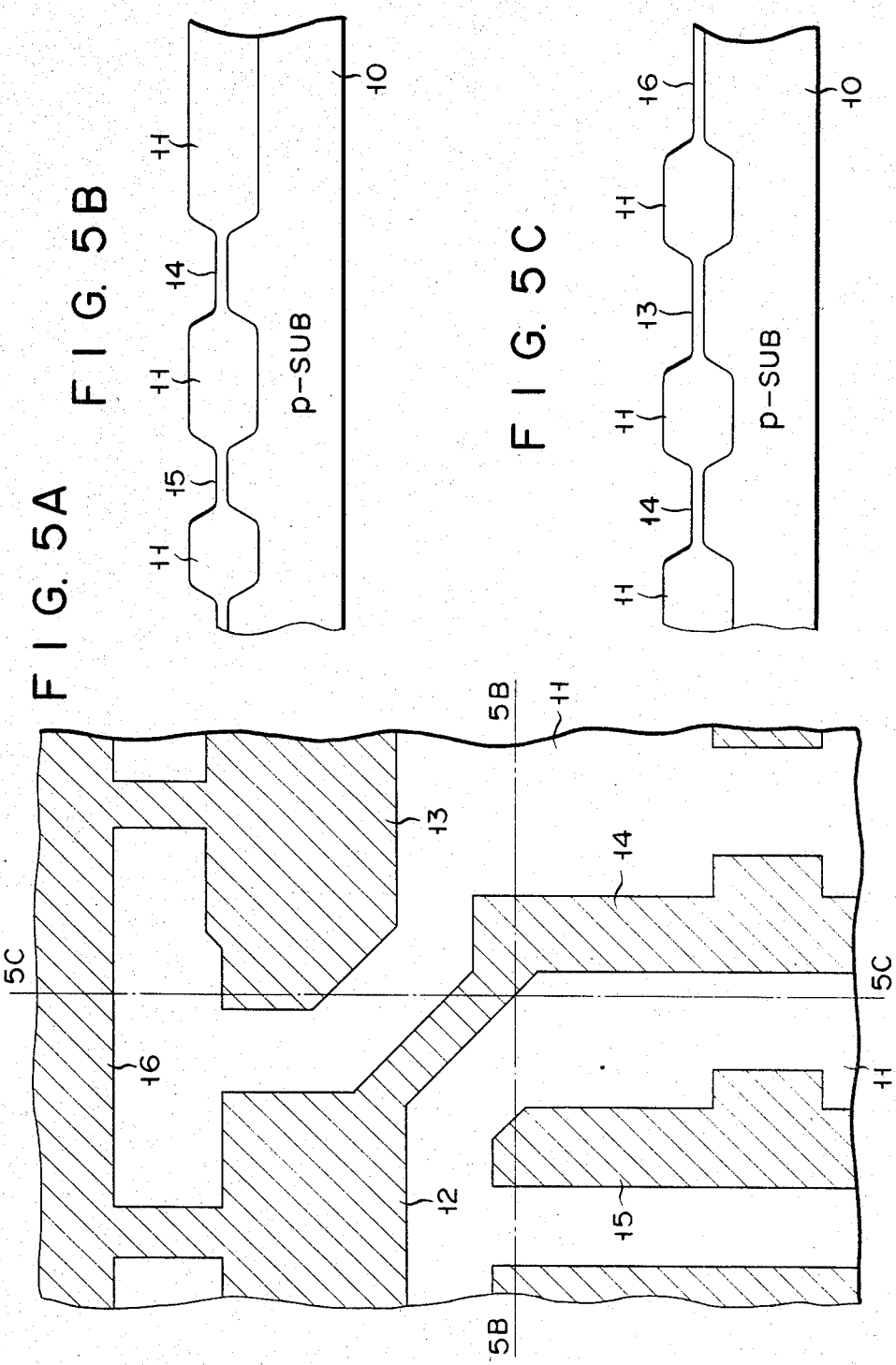

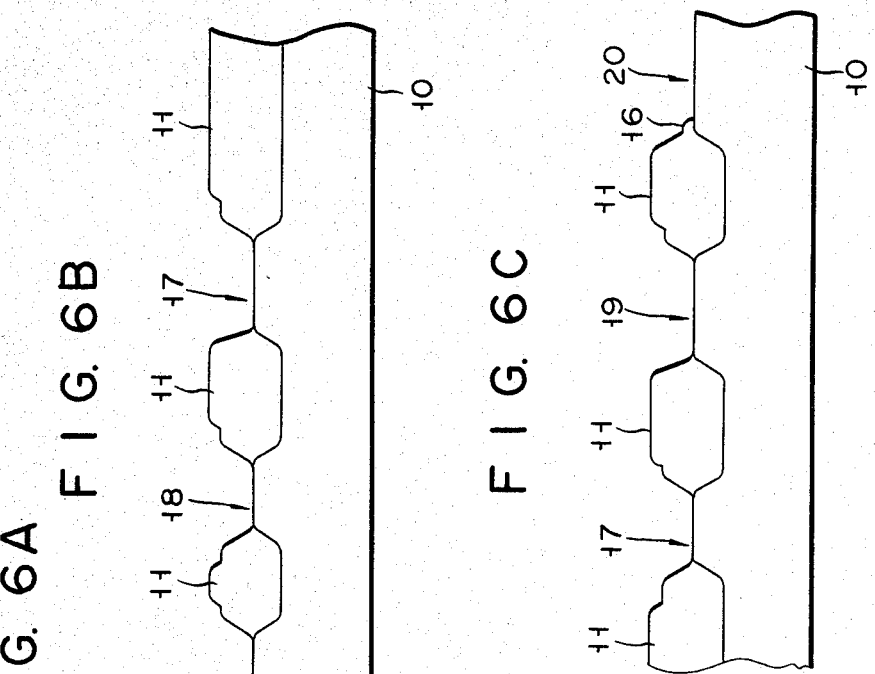
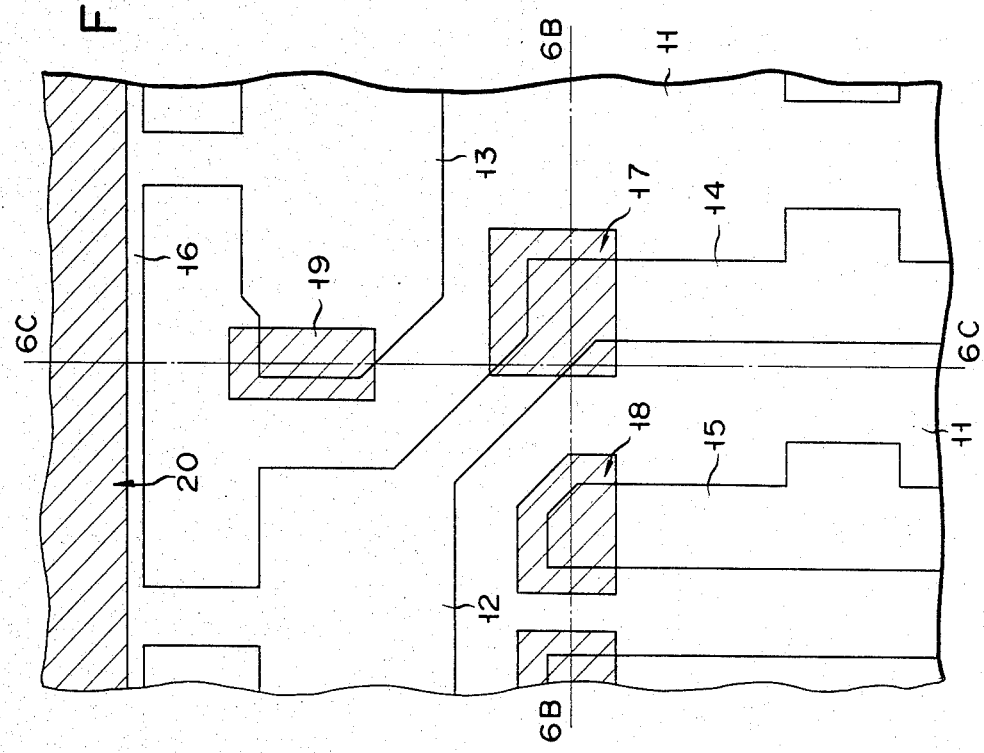

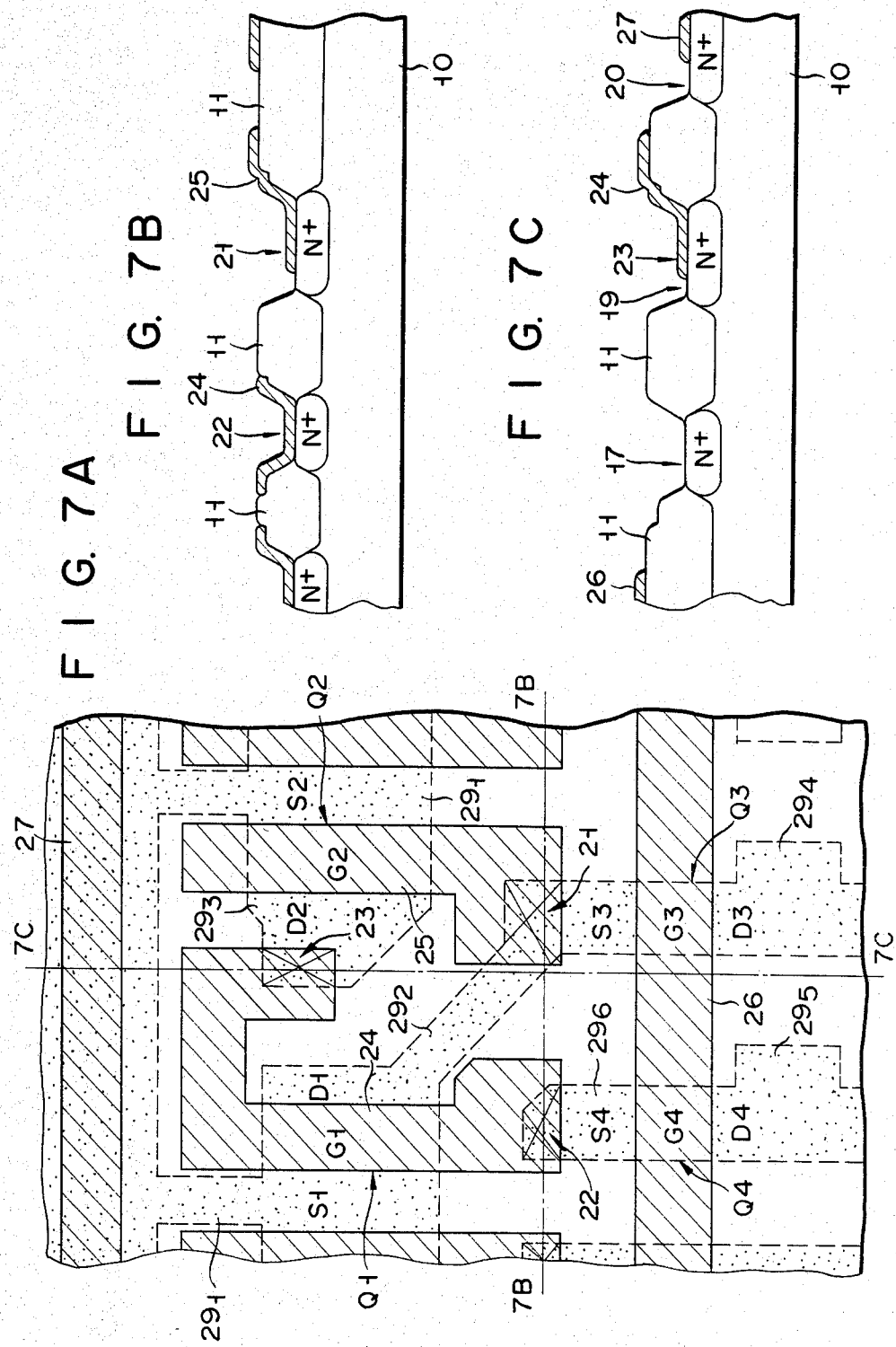

F I G. 9A
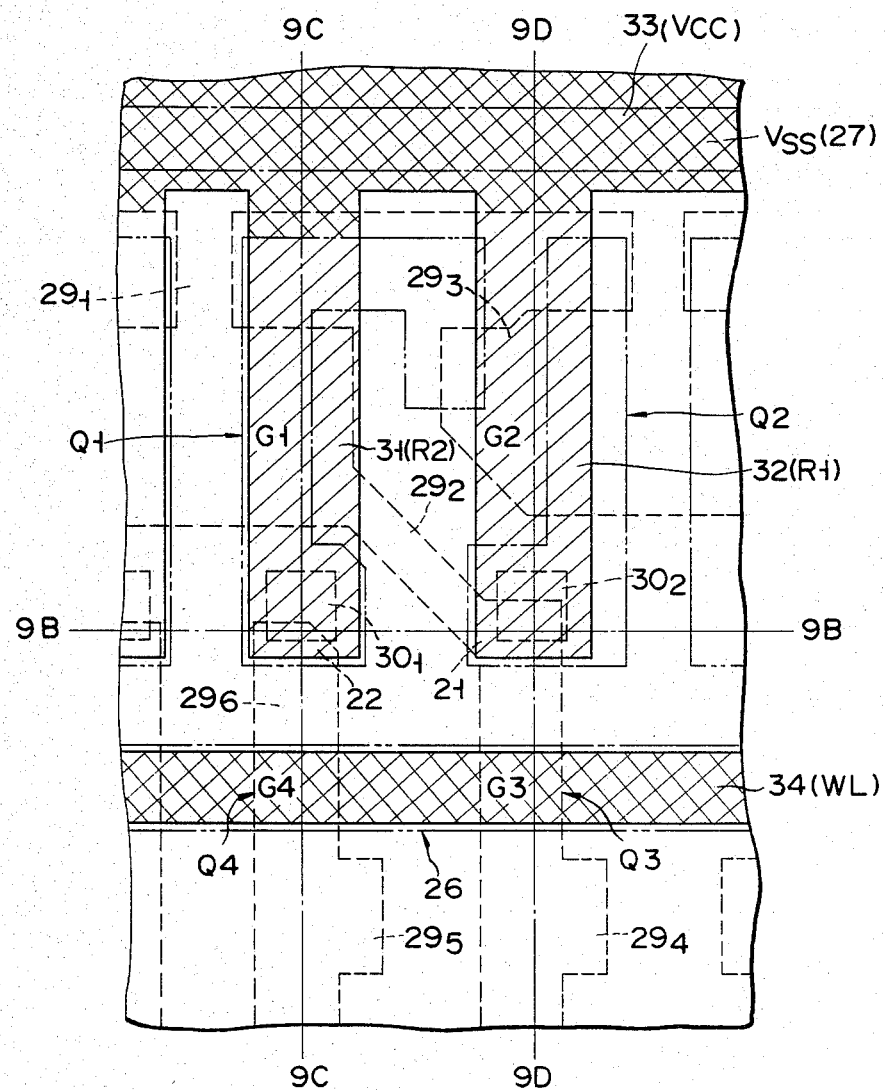

F I G. 9B
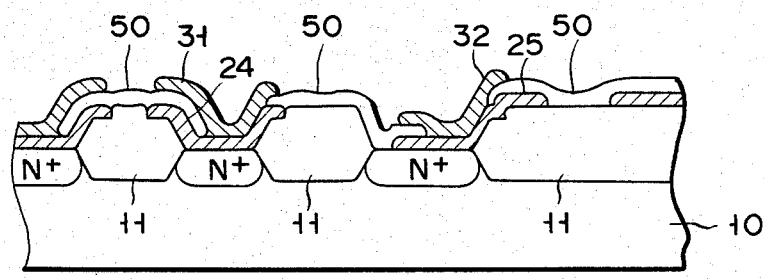
F I G. 9C
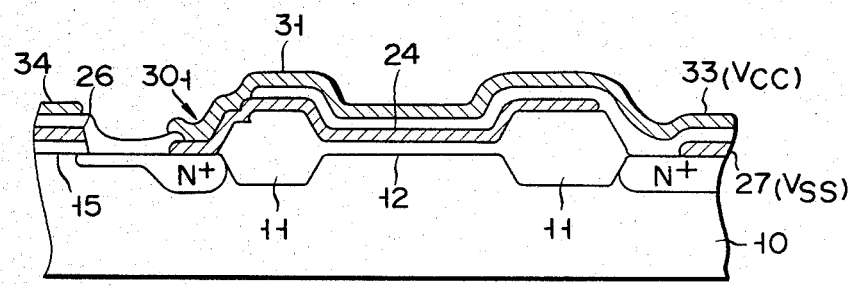
F I G. 9D
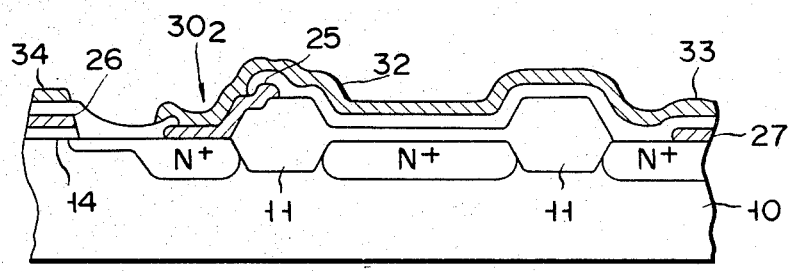

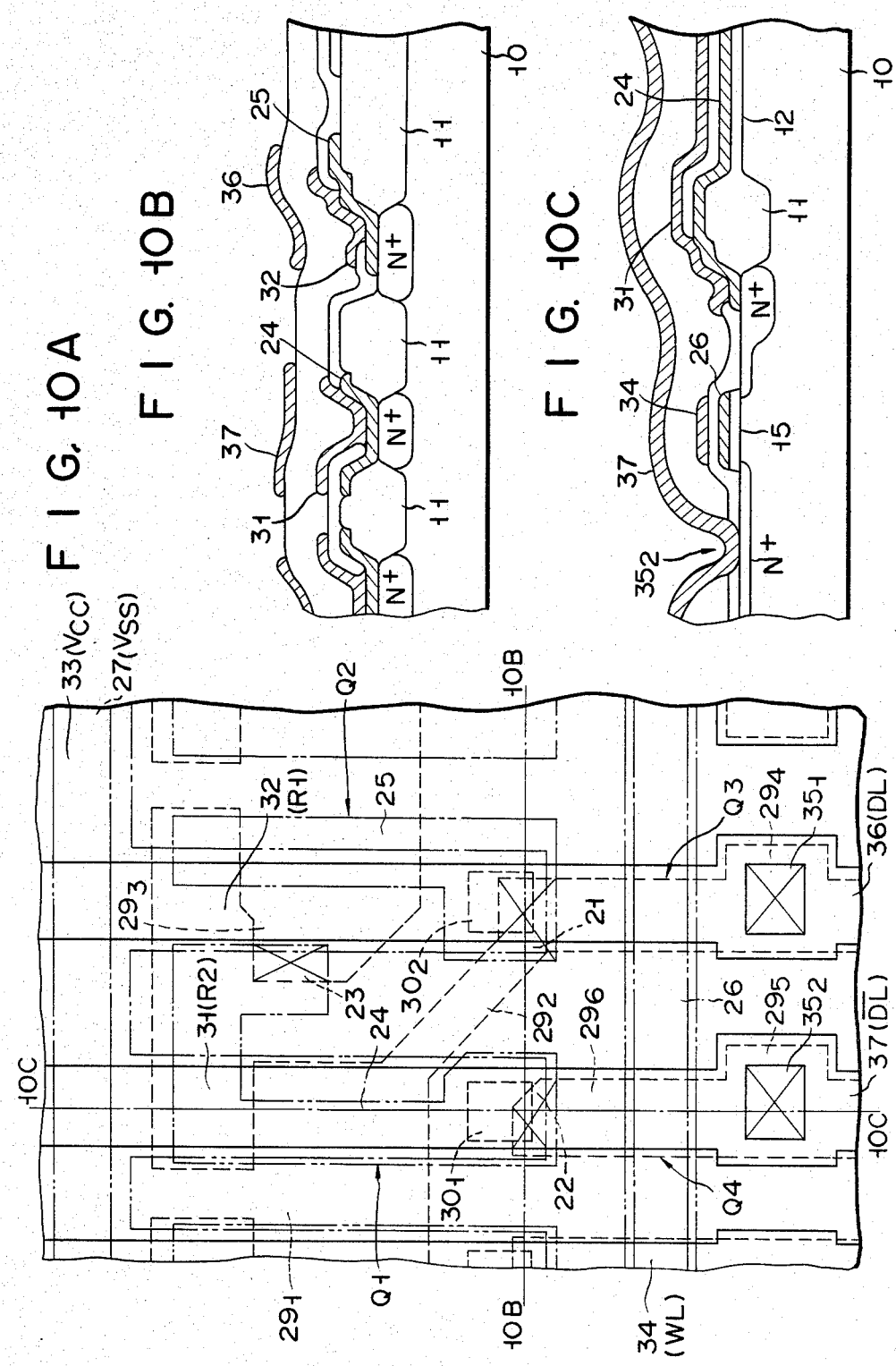

F I G. 15
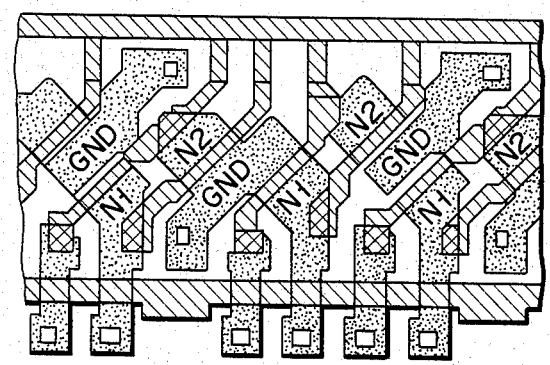
F I G. 16
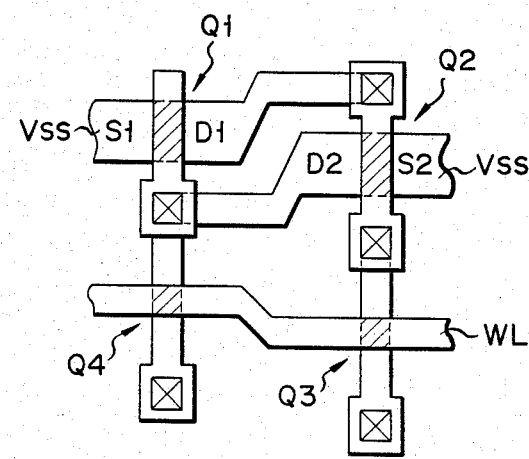
F I G. 17
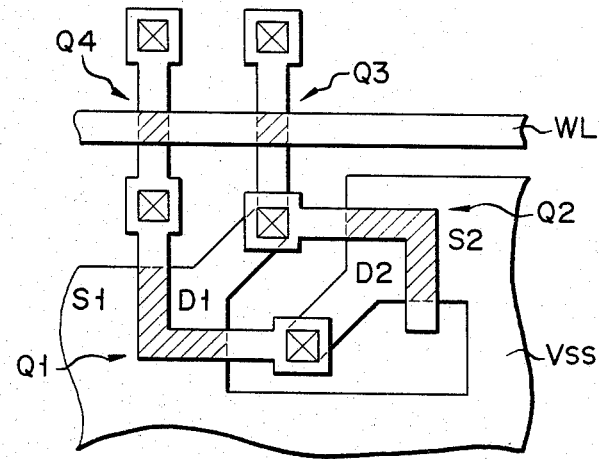

SEMICONDUCTOR MEMORY DEVICE

BACKGROUND OF THE INVENTION

The present invention relates to a semiconductor memory device, particularly to a static RAM having 4-transistor bistable type memory cells.

A typical circuit configuration of a 4-transistor bistable type static memory cell of a read/write memory or random access memory (RAM) is as shown in FIG. 1. In FIG. 1, cross-coupled MOS transistors Q1 and Q2 and drain load resistors R1 and R2 form a bistable flip-flop (FF). One node N1 of this FF is coupled via a transfer gate MOS transistor Q3 to a data line DL. The other node N2 of FF is coupled via a transfer gate MOS transistor Q4 to another data line $\overline{DL}$. The gate of each of transistors Q3 and Q4 is connected to a word line WL.

FIG. 2 shows a conventional semiconductor configuration embodying the circuit of FIG. 1. In FIG. 2, the drain area D1 of transistor Q1 is separated by a Vss line pattern from the drain area D2 of transistor Q2, and the N+ areas of nodes N1 and N2 connected to D1 and D2 are relatively large. Thus, the drains D1 and D2 of the FF are liable to absorb minority carriers produced around the N+ areas of nodes N1 and N2. Such minority carriers could be generated from the neighboring circuit element in the same semiconductor substrate and/or generated by α irradiation applied to the semiconductor. Further, a configuration such as showing FIG. 2 would cause an overly large absorption of carriers into the drain areas D1 and D2, resulting in a large soft error rate.

This is the first disadvantage of the prior art configuration of FIG. 2.

Here, the erroneous destruction of stored data caused by natural radiant rays (α particles) is called a "soft error". A soft error may be defined as random single-bit error of a memory device.

According to the configuration of FIG. 2, the figure of a gate pattern on the gate region (channel) of each of transistors Q1 and Q2 is curved. From this, as seen from FIGS. 3A–3D, if an erroneous deviation of the gate pattern mask occurs during the manufacturing of a semiconductor memory, the overlapping area between a gate electrode pattern GP and a gate region GR of semiconductor will vary. FIG. 3A shows an example of a normal or target location of the gate pattern GP with reference to the gate region GR which includes the channel region of a MOS transistor electrode. FIG. 3B shows a case where the pattern mask of gate electrode pattern GP deviates toward the right side. FIG. 3C shows a case where the pattern mask of GP deviates toward the under side. FIG. 3D shows a case where the pattern mask of GP deviates toward the right under side. In any of FIGS. 3B–3D, the overlapping area between GP and GR (hatched portion) differs from the normal one (FIG. 3A). Thus, when the position of the gate pattern mask of Q1 and Q2 deviates from the target position during the manufacture of the memory, a variation of the conductance gm of Q1, Q2 and a variation of the node capacitance CN of N1, N2 become large. Such large variations of gm and CN will cause degradation of the bistable stability of the FF. When the bistable stability is degraded, the noise margin of the FF is lowered.

This is the second disadvantage of the configuration of FIG. 2.

Here, a good bistable stability for flip-flop provides the following features:

(i) a potential difference between the high potential node (data "1") and the low potential node (data "0") before inverting the potential state of the flip-flop is sufficiently large, and (ii) the potential change curve of one node (N1) of the flip-flop is symmetrical with that of the other node (N2) with respect to the level inversion point of the flip-flop.

Further, according to FIG. 2, the extending direction of a pattern of resistor R1 differs from that of resistor R2. FIG. 4A shows a simplified example of a normal or target location of a resistor pattern RP for resistors R1 and R2 with reference to the regions of Vcc, D1 and D2 (R1=R2). FIG. 4B shows a case where the pattern mask of resistor pattern RP deviates toward the right side, and FIG. 4C shows a case where the pattern mask of RP deviates toward the under side. In the case shown in FIG. 4B, the resistance value of R1 is increased to R1B, while the resistance value of R2 does not vary (R1B>R2). In the case shown in FIG. 4C, the resistance value of R2 is increased to R2C, while the resistance value of R1 does not vary (R1<R2C). From this, if the resistor pattern mask for R1 and R2 deviates from the target position, the effective resistance value of R1 becomes different from that of R2. This also degrades the bistable stability. Therefore, when the potential of node N1 of FIG. 2 becomes close to the potential of node N2 due to an injection of carriers, an erroneous data change of the FF, or the destruction of the stored contents of the memory cell, is likely to occur.

This is the third disadvantage of the configuration of FIG. 2.

In order to satisfactorily improve the bistable stability, the gm of transistor Q1 should be as close the gm of transistor Q2 as possible, the CN of node N1 should be as close the CN of node N2 as possible and the resistance R1 should be as close the resistance R2 as possible.

The above disadvantages—large soft error rate and degradation of bistable stability—become more conspicuous as the integration density of the semiconductor device increases, and the channel width of transistors Q1 and Q2 of each memory cell becomes narrow.

SUMMARY OF THE INVENTION

It is accordingly the object of the present invention to provide a semiconductor memory device in which the occurrence of a soft error is suppressed and/or bistable stability is improved.

To achieve the above object, a memory device of the invention has a P (or N) type substrate; a first drain area $29_2$ of N (or P) type formed in the substrate; a second drain area $29_3$ of N (or P) type formed in the substrate close to the first drain area $29_2$; and a source area $29_1$ of N+ (or P+) type formed around the first and second drain areas $29_2$, $29_3$ so that the source area $29_1$ continuously surrounds the areas $29_2$, $29_3$ from three sides, e.g., right, left and top sides of these areas.

The combination of the closed arrangement of drain areas $29_2$, $29_3$ and the surrounding arrangement of source area $29_1$ decreases the influence of minority carriers generated around the drain areas $29_2$, $29_3$ and prevents unbalanced carrier absorption into the drain areas $29_2$, $29_3$, thereby suppressing the occurrence of a soft error.

According to one aspect of the invention, in the region around the overlapping area of a gate electrode pattern and a gate region of MOS transistor in the substrate, the gate electrode pattern and the gate region have straight figures and the gate electrode pattern meets the gate region at right angles.

According to the above configuration, variations of conductances gm of memory cell transistors and variations of node capacitances CN of memory cells caused by deviation of a gate pattern mask can be avoided, thereby improving bistable stability.

According to another aspect of the invention, resistor patterns (31, 32) coupled to the drain areas ($29_2$, $29_3$) have straight figures and are arranged parallel to each other.

According to the above configuration, variations of the ratio (R1/R2) of resistor patterns (31, 32) caused by deviations of a resistor pattern mask can be avoided, thereby further improving the bistable stability.

BRIEF DESCRIPTION OF THE DRAWINGS

FIGS. 5 to 10 show a semiconductor configuration of a memory cell according to the present invention: FIG. 5A illustrates thin $SiO_2$ areas (hatched) and thick $SiO_2$ field insulators formed on a P type substrate; FIG. 5B shows a cross-sectional view of FIG. 5A along the line 5B—5B; FIG. 5C shows another cross-sectional view of FIG. 5A along the line 5C—5C; FIG. 6A illustrates the patterning portions (hatched) of FIG. 5A; FIG. 6B shows a cross-sectional view of FIG. 6A along the line 6B—6B; FIG. 6C shows another cross-sectional view of FIG. 6A along the line 6C—6C; FIG. 7A illustrates the location of polysilicon regions (hatched); FIG. 7B shows a cross-sectional view of FIG. 7A along the line 7B—7B; FIG. 7C shows another cross-sectional view of FIG. 7A along the line 7C—7C; FIG. 9A illustrates the location of other polysilicon regions (hatched and cross-hatched) wherein the resistance of cross-hatched portions is noticeably lowered; FIG. 9B shows a cross-sectional view of FIG. 9A along the line 9B—9B; FIG. 9C shows another cross-sectional view of FIG. 9A along the line 9C—9C; FIG. 9D shows still another cross-sectional view of FIG. 9A along the line 9D—9D; FIG. 10A illustrates the complete configuration of the cell portion of a 4-transistor bistable static RAM corresponding to the FIG. 1 circuit; FIG. 10B shows a cross-sectional view of FIG. 10A along the line 10B—10B; FIG. 10C shows another cross-sectional view of FIG. 10A along the line 10C—10C.

FIGS. 15-17 respectively show semiconductor configurations for curves (b), (c) and (d) of FIG. 13;

DETAILED DESCRIPTION OF THE PREFERRED EMBODIMENT

Figure 1:
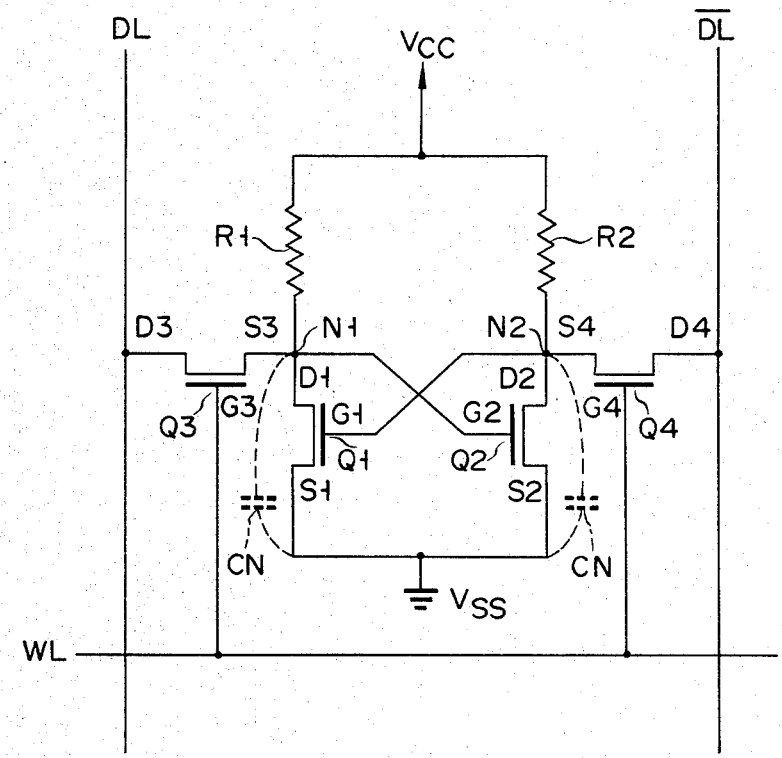
FIG. 1 shows a typical circuit configuration of a 4-transistor bistable memory cell.

In the description of the embodiment, like reference numerals are used to indicate like elements throughout the drawings for brevity's sake. The configuration of an embodiment of this invention and the process for making the same will be described referring to FIGS. 5 to 10. In this embodiment the conductivity type of the channel of MOS transistors is "N" and the equivalent circuit of the embodiment is shown in FIG. 1.

FIG. 5A shows field insulators 11 and insulating films (hatched portions). As shown in FIGS. 5A and 5C, thick field insulators 11 of $SiO_2$ (about 600 nm thick) and thin insulating films of $SiO_2$ (about 50 nm thick) are formed on a P type substrate 10. The insulating films cover a circuit element of a memory cell, wherein areas 12 and 13 are used for driver MOS transistors Q1 and Q2, areas 14 and 15 for address selection MOS transistors Q3 and Q4, and an area 16 for a reference potential line (Vss) of transistors Q1 and Q2. The shape of area 12 is roughly equal to that of area 13, and the shape of area 14 is roughly equal to that of area 15.

As shown in FIGS. 6A-6C, openings 17-19 are formed by a patterning, i.e., by selectively removing by etching the given portions of thin $SiO_2$ films on the areas 13-15. At this time an etching portion 20 is also formed by selectively removing a thin $SiO_2$ film on area 16. Such an etching portion 20 may be omitted under certain circumstances.

A polysilicon layer (not specifically shown) is grown on the whole surface of the FIG. 6 configuration until its thickness becomes about 400 nm. Phosphorus or arsenic is doped into the polysilicon layer during the growing or after completion of the growing. Then, phosphorus or the like is diffused via openings 17-19 into substrate 10 by a heat treatment, and direct contact portions 21, 22 and 23 are formed. Phosphorus or the like is also diffused via etching portion 20 into substrate 10. As shown in FIGS. 7A-7C, the above polysilicon layer is then patterned so that gate electrodes 24 and 25 of the driver MOS transistors Q1 and Q2 are formed, a polysilicon pattern 26 used for a gate electrode of each of the address selection MOS transistors Q3 and Q4 is formed, and a polysilicon pattern 27 for wiring a source area of each of transistors Q1 and Q2 is formed. Although the pattern 27 is effective in reducing the resistance of area 16, it may be omitted in a certain case. Polysilicon pattern 26 is coupled commonly to all memory cells of one word line arranged along the row direction of the memory, and is used as a word line.

Polysilicon pattern 26 and gate electrodes 24 and 25 are used as pattern masks, thereby etching thin $SiO_2$ films on the element areas 11–15 and forming gate oxide films. These element area are exposed and impurities such as phosphorus or arsenic are diffused therein. Then, N+ layers (hatched portion) are formed as shown in FIG. 7A. In this figure, an N+ layer $29_1$ defines the source areas of transistors Q1 and Q2; an N+ layer $29_2$ the drain area of transistor Q1 and the source (or drain) area of transistor Q3; an N+ layer $29_3$ the drain area of transistor Q2; an N+ layer $29_4$ the drain (or source) area of transistor Q3; an N+ layer $29_5$ the drain (or source) area of transistor Q4; and an N+ layer $29_6$ the source (or drain) area of transistor Q4. Gate electrode 24 of transistor Q1 is coupled via direct contact portion 23 to N+ layer $29_3$ which is used as the drain area of transistor Q2. Gate electrode 24 is also coupled via direct contact portion 22 to N+ layer $29_6$ which is used as the source (or drain) area of transistor Q4. Gate electrode 25 of transistor Q2 is coupled via direct contact portion 21 to the drain area of transistor Q1 and to the source (or drain) area of transistor Q3.

In FIG. 7A, N+ layers $29_2$, $29_3$ and $29_6$, which are used as the drain areas of a pair of transistors Q1 and Q2, are so arranged that these N+ layers face each other; N+ layer $29_1$, used as the source area, is arranged such that the layer $29_1$ surrounds N+ drain layers $29_2$ and $29_3$ of transistors Q1 and Q2 and also surrounds gate electrodes 24 and 25 from three directions, e.g., from the right side, left side and upper side of 24, 25, $29_2$ and $29_3$.

Figure 8A:
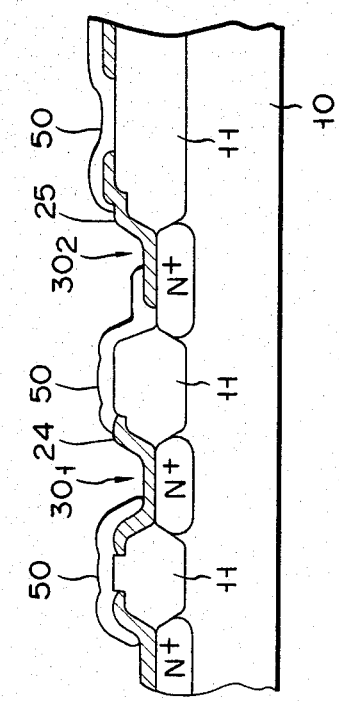
FIG. 8A illustrates the location of contact holes of gate patterns.
Figure 8B:
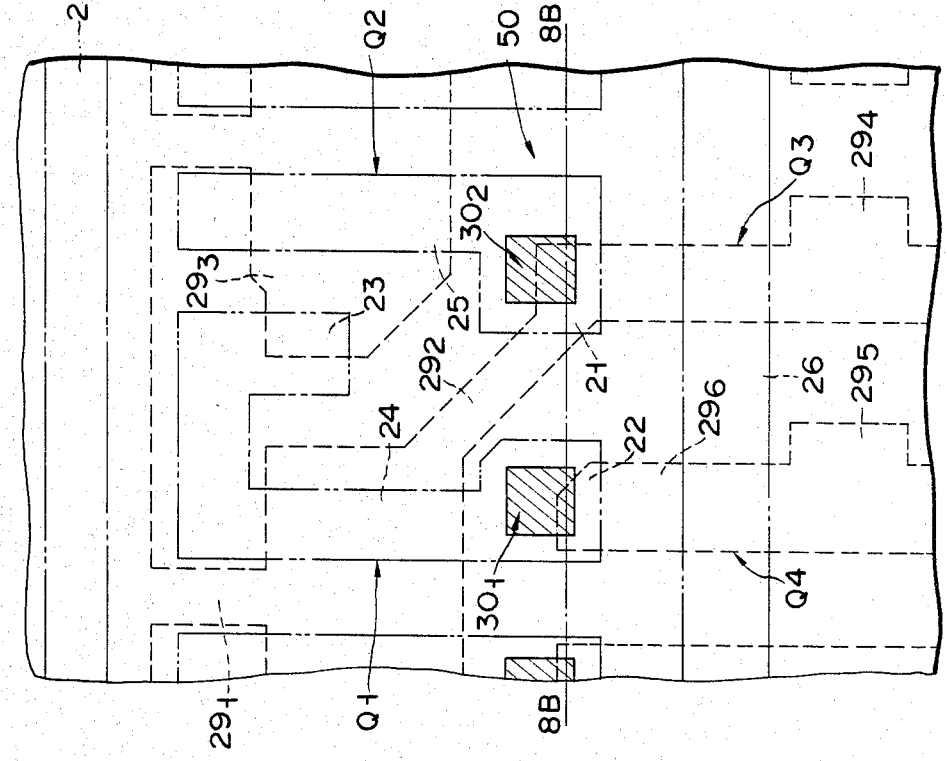
FIG. 8B shows a cross-sectional view of FIG. 8A along the line 8B—8B.

A $SiO_2$ film about 300 nm thick is formed by means of thermal oxidation or vapor phase growth. Then, as shown in FIGS. 8A and 8B, $SiO_2$ films 50 on the polysilicon pattern of gate electrodes 24 and 25 are selectively etched, and contact holes $30_1$ and $30_2$ are formed. These contact holes $30_1$ and $30_2$ are respectively arranged on data lines in order to obtain the optimum balance of high resistance elements of a polysilicon layer which will be mentioned later.

A polysilicon layer is formed by a vapor phase growth method or the like on the whole surface, and patternings are then carried out. The resistance of crosshatched portions shown in FIG. 9A is lowered by diffusing high-concentration impurities into specific portions of the polysilicon layer which are designed to have low resistance. This diffusion may be performed by a PEP (photo engraving process) technique. Then, high resistance elements 31 and 32 are formed (FIGS. 9A-9D). Element 31 is made of a straight polysilicon layer which is coupled via contact hole $30_1$ and gate electrode 24 to the drain area (N+ layer) $29_3$ of transistor Q2. Element 32 is made of a polysilicon layer which is coupled via contact hole $30_2$ and gate electrode 25 to the drain area (N+ layer) $29_2$ of transistor Q1. The shape and length of element 32 are equal to those of element 31. A polysilicon wiring 33 is formed on the area 16 which is used as a reference potential line (Vss) of transistors Q1 and Q2. Wiring 33 is coupled to high resistance elements 31 and 32, and is used as a common power supply line (Vcc). Further, a word line (WL) is also formed. Word line WL (or 34) has a double-layered structure (FIGS. 9C and 9D) in which a polysilicon pattern 34 is layered on and coupled to the polysilicon pattern 26 via a contact portion (not shown). It is not absolutely necessary to make the word line WL double-layered, however, it can only be made by the polysilicon pattern 26.

After completing the formation of a passivation film, the $SiO_2$ film and passivation film on the drain (or source) areas $29_4$ and $29_5$ of transistors Q3 and Q4 are selectively removed by etching, and contact holes $35_1$ and $35_2$ are formed (FIGS. 10A-10C). Then, an evaporation of aluminium (Al) and given patternings are carried out, and data lines 36 and 37 (DL, $\overline{DL}$) of Al are formed. Data lines 36 and 37 are coupled via contact holes $35_1$ and $35_2$ to the drain (or source) areas $29_4$ and $29_5$ of transistors Q3 and Q4, respectively.

In a semiconductor memory device manufactured according to the above-mentioned process, the drain areas (N+ layers) $29_2$, $29_3$ and $29_6$ of a pair of driver MOS transistors Q1 and Q2 closely face each other, the gate electrodes 24 and 25 are coupled via direct contact portions 21-23 to the drain areas $29_2$, $29_3$ and $29_6$ so that the transistors Q1 and Q2 are cross-coupled to each other, and the source area (N+ layer) $29_1$ surrounds the coupled drain areas $29_2$ and $29_3$ as well as the gate electrodes 24 and 25 from three directions (i.e., the right, left and upper sides of FIG. 7A). Further, a pair of address selection MOS transistors Q3 and Q4 are arranged at fixed locations along the direction of data lines 36 and 37, and a pair of high resistance elements 31 and 32 are arranged on $SiO_2$ films over the gate electrodes 24 and 25 (FIGS. 10A-10C). Each of these elements 31 and 32 has a straight figure and the same pattern length (FIG. 9A), and these elements are coupled via contact holes $30_1$ and $30_2$ to the gate electrodes 24 and 25, respectively. Contact holes $30_1$ and $30_2$ are opened at fixed positions along the direction of data lines 36 and 37 (FIG. 10A).

Figure 10D:
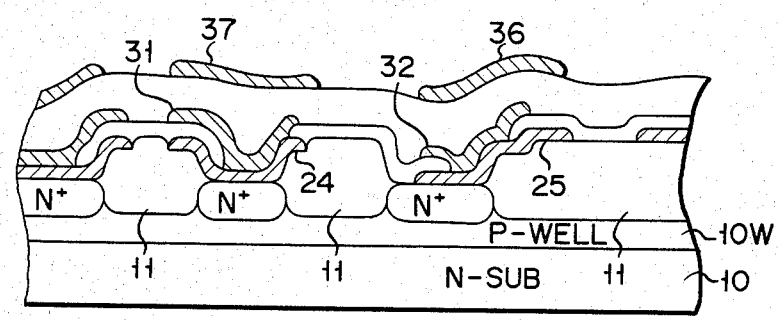
FIGS. 10D and 10E respectively show modifications of FIGS. 10B and 10C wherein the memory cell structure is formed in a P-well of an N type substrate.
Figure 10E:
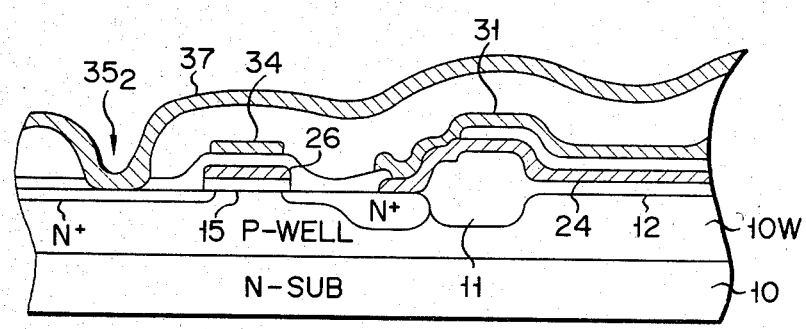

FIGS. 10D and 10E illustrate modifications of FIGS. 10B and 10C, respectively. In the embodiment of FIGS. 10B and 10C, the memory cell structure is formed on a P type substrate. On the other hand, according to the configuration of FIGS. 10D and 10E, the memory cell structure is formed on a P-well 10W which is provided in an N type substrate 10. The configuration of FIGS. 10D and 10E is more advantageous than that of FIGS. 10B and 10C with respect to a soft error rate.

Figure 3A:
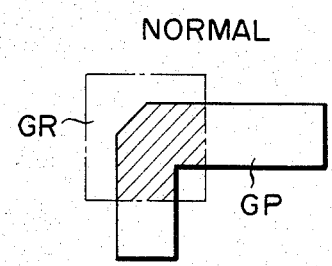
FIGS. 3A-3D illustrate how the gate area (hatched portion) of a cell transistor of FIG. 2 varies when a pattern mask position of a gate pattern GP deviates.
Figure 3B:
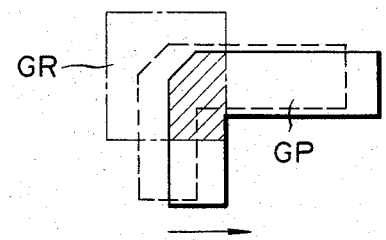
Figure 3C:
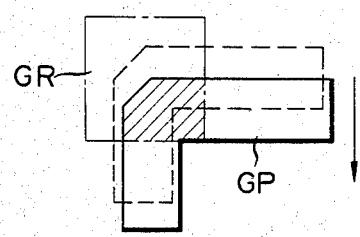
Figure 3D:
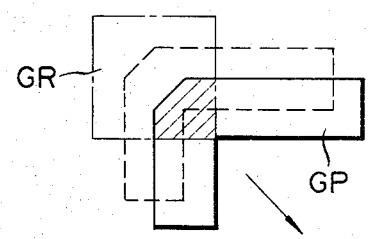
Figure 11A:
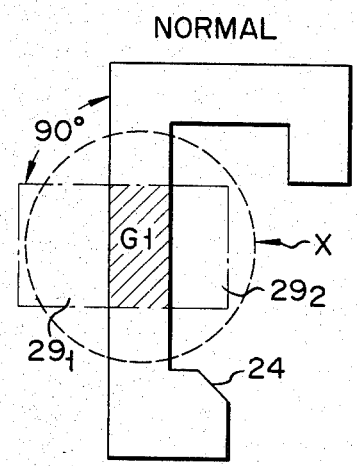
FIGS. 11A-11D illustrate how the gate area (hatched portion G1) of a cell transistor of FIG. 7A (this invention) is kept constant when a pattern mask position of a gate pattern (24) deviates.
Figure 11B:
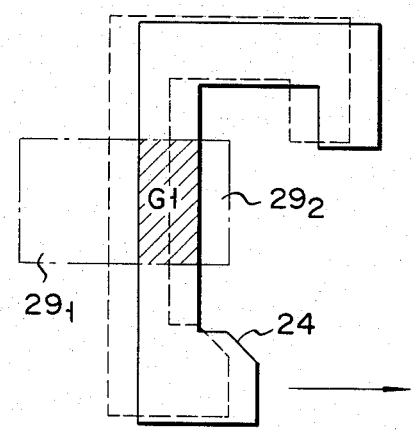
Figure 11C:
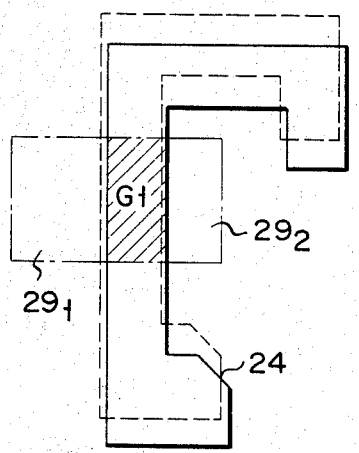
Figure 11D:
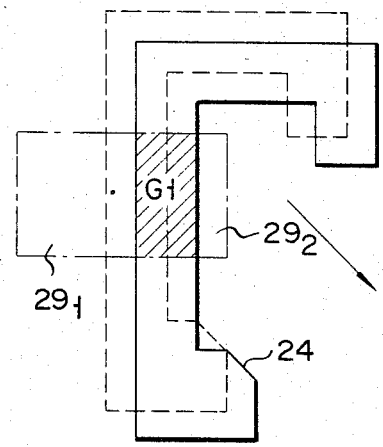

FIGS. 11A-11D illustrate how the gate area of a cell transistor of FIG. 7A is kept constant when a pattern mask position of a gate pattern 24 deviates from a normal or target position. The essential feature of FIG. 11A is that, at a place X around the overlapping area (hatched portion) of gate electrode pattern 24 and gate region G1, the straight portion of pattern 24 meets the straight portion of region G1 at right angles. FIG. 11B shows a case where the pattern mask of 24 deviates toward the right side. In this case the amount of overlapping area of G1 (hatched) does not vary from that of FIG. 11A (Compare with FIG. 3B). FIG. 11C shows a case where the pattern mask of 24 deviates toward the under side. In the case of FIG. 11C, the amount of overlapping area of G1 does not vary (Compare with FIG. 3C). FIG. 11D shows a case where the pattern mask of 24 deviates toward the right under side. In the case of FIG. 11D, the amount of overlapping area of G1 also does not vary (Compare with FIG. 3D).

The node capacitance CN and the conductance gm of a transistor Q1 (or Q2) of a memory cell depend on the amount of overlapping area G1 (or G2). As is evident from FIGS. 11A–11D, the area G1 does not vary even if the pattern mask of gate pattern 24 deviates from a normal position. Thus, variations of the gm and CN of the memory cell can be avoided according to the present invention. Accordingly, the bistable stability of the memory cell flip-flop of this invention is good and is free from influence of an erroneous pattern mask deviation.

Figure 4A:
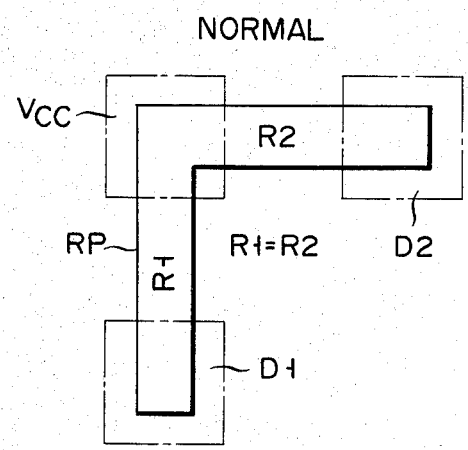
FIGS. 4A-4C illustrate how the load resistors R1 and R2 of a memory cell of FIG. 2 vary when a pattern mask position of a resistor pattern RP deviates.
Figure 4B:
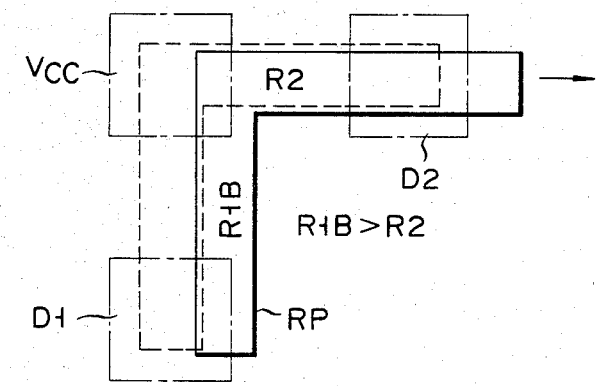
Figure 4C:
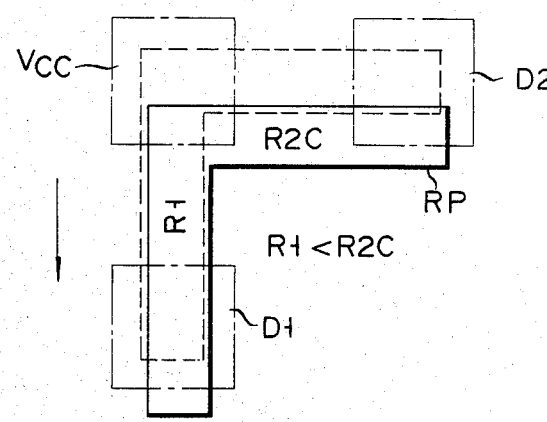
Figure 12A:
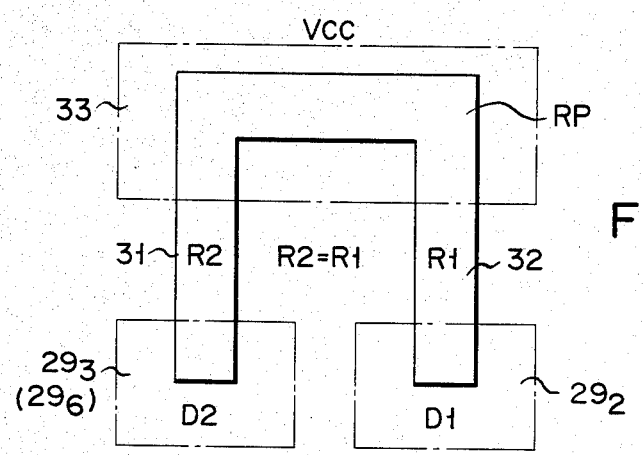
FIGS. 12A-12C illustrate how the ratio R1/R2 of load resistors R1 and R2 shown in FIG. 9A (this invention) is kept constant when a pattern mask position of the resistor pattern (31, 32) deviates.
Figure 12B:
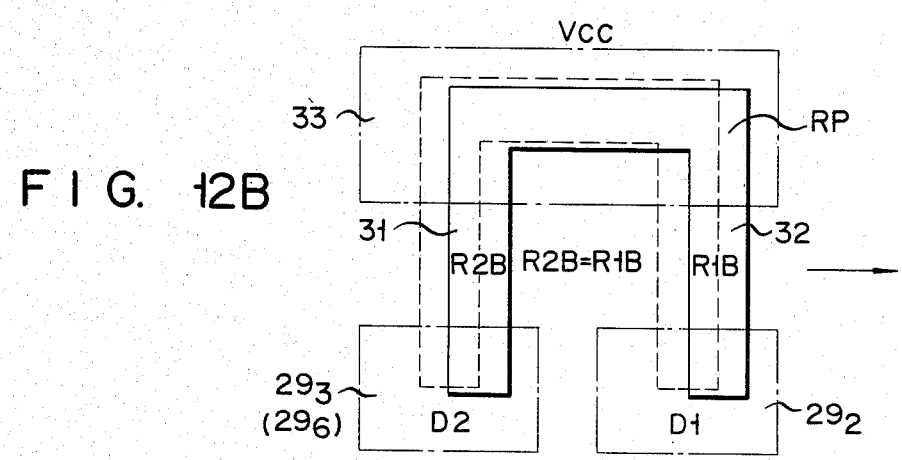
Figure 12C:
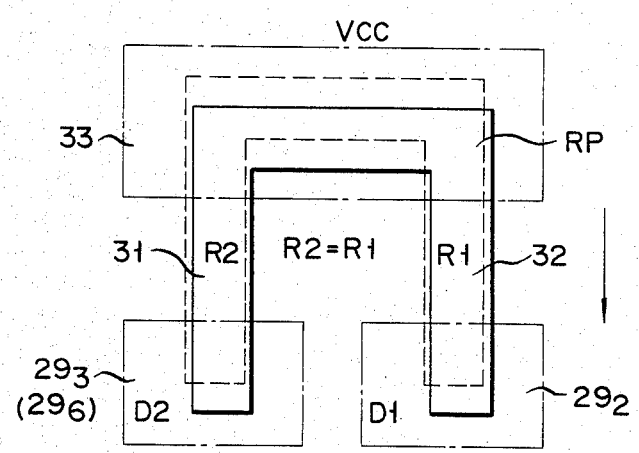

FIG. 12A shows a simplified model of a normal or target location of a resistor pattern RP for resistors R1 and R2. Pattern RP is used for making resistance elements 31 and 32 of FIG. 9A. FIG. 12B shows a case where the pattern mask of pattern RP deviates toward the right side. In this case the resistance values of elements 31 and 32 do not vary, or in some cases, they increase with the same rate from R2 and R1 to R2B and R1B, respectively, but the resistance ratio remains constant, i.e., R1/R2=R1B/R2B (Compare with FIG. 4B). FIG. 12C shows a case where the pattern mask of RP deviates toward the under side. In FIG. 12C, the resistance values of elements 31 and 32 do not vary and the resistance ratio R1/R2 remains constant (Compare with FIG. 4C).

As is evident from FIGS. 12A–12C, the balance of load resistors R1 and R2 of the memory cell flip-flop is kept constant even if the pattern mask RP of resistor elements 31 and 32 deviates from a normal position. Accordingly, the bistable stability of the memory cell of this invention is free from the influence of an erroneous pattern mask deviation.

The following should be clear from a semiconductor memory device having a configuration as shown in FIGS. 10A–10C.

As is well known, in the case of a dynamic RAM, the fraction defective of memory cells due to a soft error prominently increases as the node capacitance of the memory cell decreases below 50 pF (See ISSCC 82 WPM 7.5 pp. 74–75). The number of electron-positive hole pairs produced by α particles having an energy of 5 MeV is about $1.4 \times 10^6$. When the node capacitance CN of memory cell is 50 pF, the electric charges stored in the node is about $2.25 \times 10^{-13}$ coulombs, and so the number of electrons in the node is about $1.4 \times 10^6$. Thus, the number of electrons in the 50 pF node is almost equal to the number of electron-positive hole pairs produced by the 5 MeV α particles. This is why soft errors increase as the node capacitance decreases below 50 pF. The above discussion, however, is only a summary, for the sake of brevity. In practice, a soft error of a dynamic RAM is subjected to the influence of a critical electric charge amount, and further, the collection efficiency of an electron-positive hole pair is, in fact, not "1".

The above discussion is also applicable to a static RAM. The following discussion will be given with respect to a specific semiconductor memory device such as a 16 k-bit static RAM which has a node capacitance CN equal to or less than 50 pF, wherein various layouts and structures of the memory cell are considered.

Figure 13:
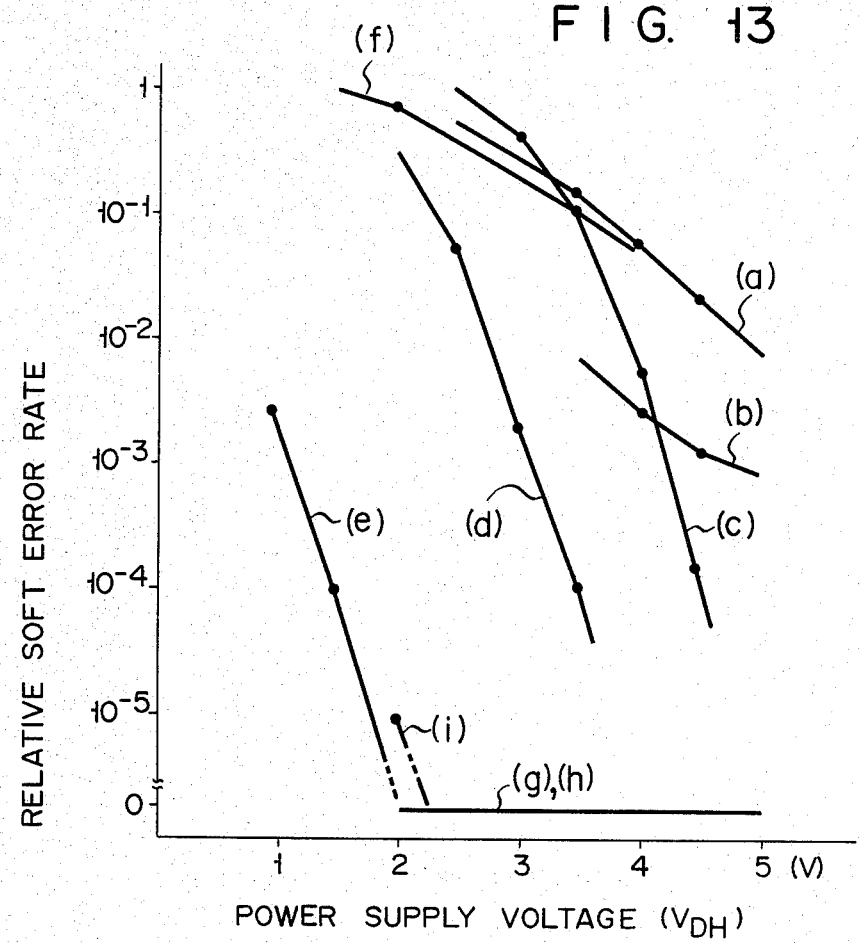
FIG. 13 is a graph showing a relation between a relative soft error rate and a power supply voltage for a memory cell, wherein curve (a) represents a memory cell of FIG. 2, curve (b) a memory cell of FIG. 15, curve (c) a memory cell of FIG. 16, curve (d) a memory cell of FIG. 17, curve (e) a memory cell having a configuration of FIG. 15 and being formed in a P-well, curve (f) a memory cell having a configuration of FIG. 2 and being formed in a P-well, and each of the curves (g), (h) and (i) represents a memory cell having a configuration of FIGS. 10A-10C.
Figure 14:
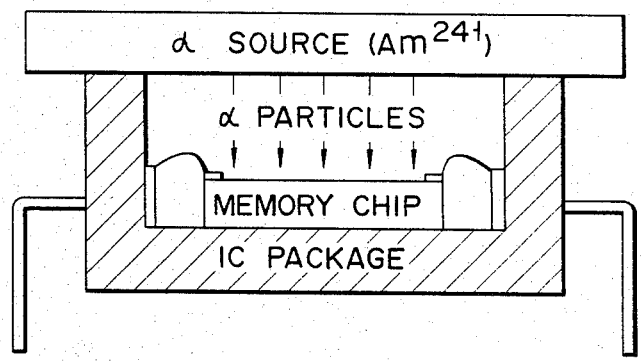
FIG. 14 shows a summarized configuration of a test device for obtaining the result of FIG. 13.

FIG. 13 shows a relation between the relative soft error rate and the power supply voltage for the memory cell flip-flop. FIG. 14 shows a summarized configuration of a test device for obtaining the results of FIG. 13. In FIG. 14, radioactive americium $Am^{241}$ is used for the source of α particles. The distance from the α source to the surface of a semiconductor memory chip to be tested is 1.5 mm. The ambient temperature is maintained at 25° C.

Figure 2:
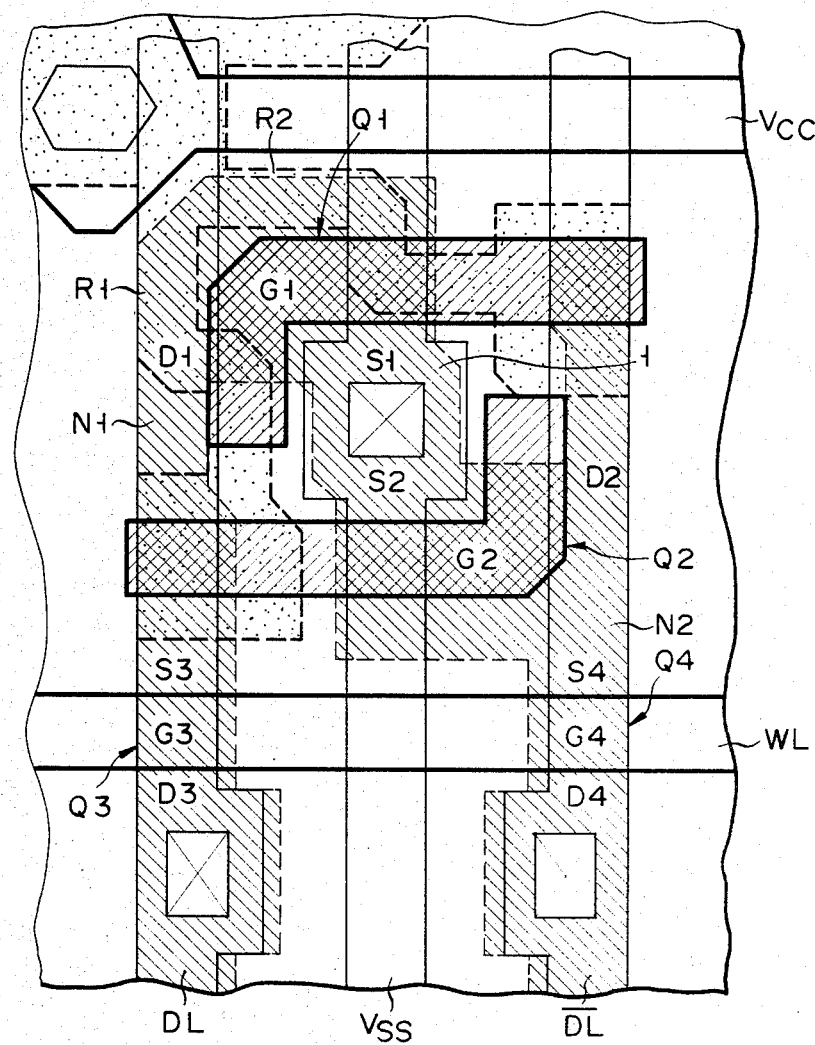
FIG. 2 shows a prior art semiconductor configuration embodying the circuit of FIG. 1.

In FIG. 13, the plotted curve (a) represents the memory cell of FIG. 2, the capacitance of which is 40 pF or more. The plotted curve (b) represents the memory cell having an arrangement as in FIG. 15. In FIG. 15, the memory nodes or drain areas of a pair of driver MOS transistors face each other and an N+ layer for Vss is arranged around the memory nodes. The node capacitance of this memory cell is 40 pF (c.f., National Convention Records of the Institute of Electronics and Communication Engineers No. 2-217, 1982). According to the configuration of FIG. 15, although the diffusion layers of memory nodes or the drain areas of a pair of driver MOS transistors face each other, the source area of a pair of MOS transistors is not continuous around three sides of these transistors, which is in contrast to the configuration of the present invention. Thus, consideration of the layout is insufficient, resulting in less effect for reducing a soft error.

In FIG. 13, the plotted curves (c) and (d) represent specific cells of FIGS. 16 and 17, respectively. The configuration of each cell of FIGS. 16 and 17 somewhat resembles the configuration of this invention. According to the configuration of (c) or FIG. 16, the N+ layer for Vss is arranged around the memory nodes from two directions. According to the configuration of (d) or FIG. 17, the N+ layer for Vss around the memory nodes is continuous around three directions of L-shaped driver MOS transistors. The node capacitance of each memory cell of (c) and (d) is 40 pF. According to the configuration of (c), the resistance balance of high resistance elements being formed of polysilicon layers is undesirable. According to the configuration of (d), not only is the resistance balance of high resistance elements undesirable, but also the bistable stability of the memory cell is liable to be degraded, because the flip-flop transistors have L-shaped configurations.

In FIG. 13, the plotted curve (e) represents a specific cell which is equivalent to a case where the cell of (b) is provided in a P-well of the semiconductor substrate. According to the configuration of (e), where $V_{DH} \geq 2$ volts, the cell is free from a soft error. However, this cell is subjected to a certain soft error when $V_{DH} < 1.5$ volts, and the soft error rate becomes large as the memory node capacitance becomes small (in the case of (e), the soft error rate increases when the node capacitance becomes less than 40 pF). According to a configuration such as (e), a C-MOS process in which the cell is provided in a P-well must inevitably be used and, therefore, such a configuration is disadvantageous in view of productivity (See ISSCC 80 FAM 17.3 p.224).

In FIG. 13, the plotted curve (f) represents a specific cell which is equivalent to a case where a cell having a layout similar to the cell of (a) is provided in a P-well of the semiconductor substrate, and has a memory node capacitance of about 20 pF. Since the memory node capacitance of the (f) cell is less than that of the (a) cell, it is not satisfactory even if a C-MOS process is employed.

In FIG. 13, the plotted curves (g), (h) and (i) represent cells having a configuration of FIG. 10A which shows a semiconductor memory device of the present invention. Curves (g), (h) and (i) show memory node capacitances of about 40 pF, 20 pF and 10 pF, respectively. According to the configuration of these cells, when the memory node capacitance is equal to or more than 20 pF, the memory cell is completely free from a soft error. In addition, even in around 10 pF, the memory cell of the invention almost always avoids a soft error, although it has a bulky structure.

Incidentally, the cell of (i) hypothetically represents a static RAM having a memory node capacity of 256 k bits. The curve (i) teaches that a soft error-free 256 k-bit static RAM is possible without using a costly coating material such as polyimide. Of course, when such a cell is formed in a P-well of a C-MOS structure, the memory node capacity may be further increased.

Figure 18:
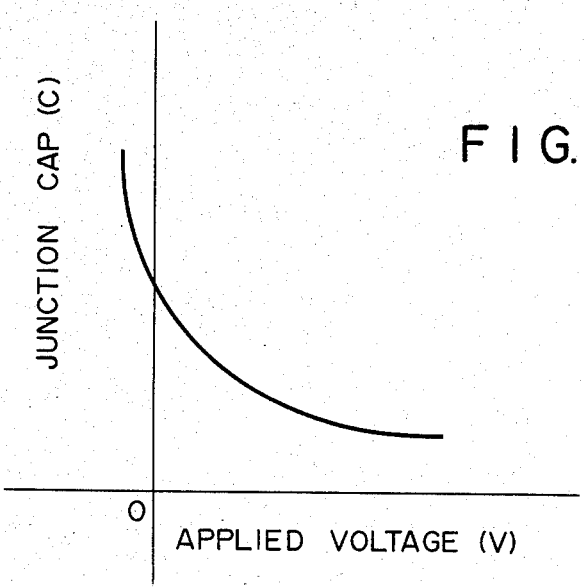
FIG. 18 is a graph showing a relation between a junction capacitance and a voltage applied thereto.

Now, the balance of resistance values of high resistance elements formed of a polysilicon layer will be discussed. Major components of a node capacitance of memory cells are a gate capacitance and a junction capacitance. A relation between the gate capacitance and the applied voltage shows a linear characteristic, while a relation between the junction capacitance and the applied voltage shows a nonlinear characteristic as shown in FIG. 18. As seen from FIG. 18, the variation rate $\Delta C/\Delta V$ becomes large as the applied voltage becomes small. Accordingly, where the applied voltage is small, even if minority carriers due to $\alpha$ particles are injected into the memory cell, a degree of level down of logical "1" is small. From this, when the cell is subjected to $\alpha$ irradiation, the possibility that the logical "1" level will become close to logical "0" increases. However, according to the present invention, even if the "1" level becomes close to the "0" level, the "1" level can readily return to a normal high potential, and therefore the cell is stable. This is because the shape of each of the high resistance elements 31 and 32 formed of a polysilicon layer is straight and the length of element 31 is equal to that of element 32, resulting in well balanced resistances of high resistance elements 31 and 32.

Figure 19:
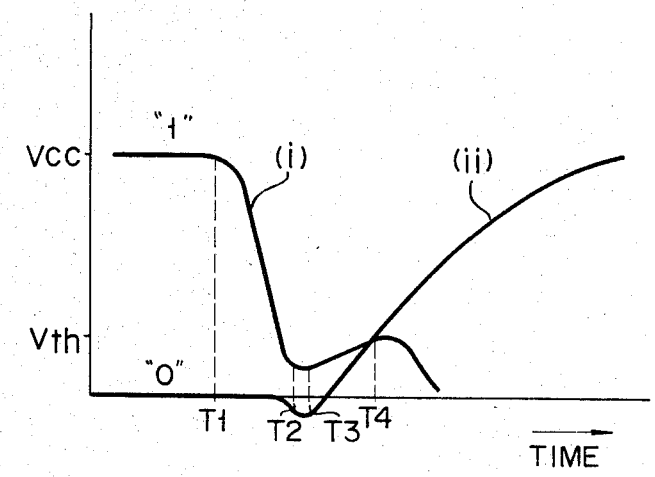
FIG. 19 is a graph illustrating node potential changes of the flip-flop of FIG. 2.
Figure 20:
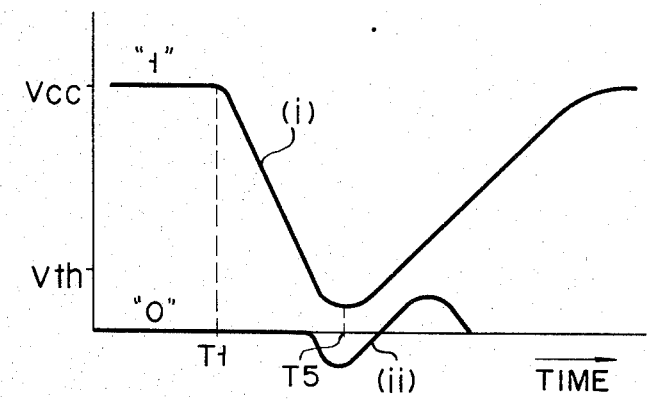
FIG. 20 is a graph illustrating node potential changes of the flip-flop of FIG. 10A.

Now, description will be given as to how the data stored in a cell of a semiconductor memory device is changed, regarding a case where an N channel static RAM employing a substrate biasing circuit is subjected to $\alpha$ irradiation. FIG. 19 illustrates how the stored data in the cell of FIG. 2 is changed by $\alpha$ particles. FIG. 20 illustrates how the stored data in the cell of FIG. 10A is influenced by $\alpha$ particles and how the influenced data returns to a normal state. It should be noted here that FIGS. 19 and 20 are simulation data.

In FIGS. 19 and 20, letters (i) and (ii) respectively indicate potential variations of "1" level and "0" level. These variations are caused by $\alpha$ particles.

In FIG. 19, when the memory cell is subjected to $\alpha$ irradiation at time T1, the potential of "1" level rapidly falls until time T2. After time T3, the potentials of "1" and "0" become close to each other and cross at time T4. In other words, the potential state of the cell flip-flop is erroneously inverted at time T4. At time T4, the stored data of the cell is destroyed. In FIG. 19, the curves (i) and (ii) from time T1 to time T2 imply an imbalance of the capacitances of flip-flop nodes and also imply that the cell is sensitive to $\alpha$ particles. The curves (i) and (ii) around time T4 show an imbalance of high resistance elements for the load resistors.

On the other hand, FIG. 20 teaches that even if the cell is subjected to $\alpha$ irradiation at time T1, the cell is less sensitive to $\alpha$ particles. The slope of potential change of "1" level shown in FIG. 20 is more gentle than that shown in FIG. 19. The curves (i) and (ii) of FIG. 20 at time T5 indicate that the potential change of "1" level is similar to that of "0" level and therefore the flip-flop node capacitances are well balanced. Further, the curves (i) and (ii) after time T5 indicate that the resistances of high resistance elements formed of polysilicon layers are well balanced. As mentioned, the present invention is superior to the prior art with regard to a soft error, a balance of flip-flop node capacitances and a balance of the resistances of high resistance elements.

The advantages obtained from the present invention are as follows.

(1) The memory cell is less sensitive to minority carriers produced by $\alpha$ particles or generated from a neighboring circuit and, even if the cell is subjected to such minority carriers, the stored data is seldom destroyed because the minority carriers are not absorbed in an unbalanced fashion in the region of the flip-flop nodes. This advantage can be obtained from a configuration where the drain areas $29_2$, $29_3$ and $29_6$ are arranged close to each other and face each other, and where the source area $29_1$ continuously surrounds the gate electrodes 24, 25 and the drain areas $29_2$, $29_3$ of driver MOS transistors on their three sides.

(2) The flip-flop node capacitances are well balanced and the stored data is rarely destroyed. This is because the conductance gm and gate capacitance CN of a pair of driver MOS transistors do not vary even when a pattern mask for patterning the cell erroneously deviates from a normal or target position.

(3) Since the resistances of high resistance elements formed of polysilicon layers are well balanced, even if the cell is influenced by minority carriers as mentioned in (1) above, the influenced data of a cell can readily return to a normal state.

Although explanations have been given herein with reference to a specific embodiment using N channel transistors, the present invention may, of course, be applied to a device using P channel transistors. In this case the same advantages as in the case of N channel can be obtained. When the memory cell is provided on a P-well formed in an N type substrate, for example, the cell may have an N channel enhancement/register structure and the peripheral circuitry of the memory may have a C-MOS structure.

According to the present invention, even where the capacitance of a flip-flop node becomes small with a minimization of the integrated elements, it is possible to provide a semiconductor memory device which is free from a soft error, has an excellent ability to maintain the stored data, and which enables the potential state influenced by $\alpha$ particles to return the normal state.

What is claimed is:

1. A semiconductor memory device including memory cells which have bistable flip-flop circuits formed of cross-coupled transistors, comprising:
   a semiconductor substrate;
   a first drain area of one of said cross-coupled transistors formed at a given position on said substrate, said first drain area being of a first conductivity type;
   a second drain area of another of said cross-coupled transistors being so formed in said substrate that said second drain area is arranged close to said first drain area, said second drain area being of said first conductivity type; and
   a source area of said cross-coupled transistors being so formed in said substrate that said source area surrounds said first and second drain areas from three sides of a location in which said cross-coupled transistors are formed, said source area being of said first conductivity type.

2. The device of claim 1, wherein each of said cross-coupled transistors has a gate region and a gate electrode pattern formed on said gate region and, at a location near the overlap area of said gate electrode pattern and said gate region, both said gate region and said gate electrode pattern have straight figures, and the straight portion of said gate region meets that of said gate electrode pattern at substantially right angles.

3. The device of claim 1, wherein said bistable flip-flop circuit includes a pair of load resistor elements respectively coupled to said first and second drain areas, and a first resistor pattern for forming one of said load resistor elements is arranged substantially parallel to a second resistor pattern for forming the other of said load resistor elements.

4. The device of claim 3, wherein each of said first and second resistor patterns has a straight figure along their parallel arrangement.

5. The device of claim 2, wherein said bistable flip-flop circuit includes a pair of load resistor elements respectively coupled to said first and second drain areas, and a first resistor pattern for forming one of said load resistor elements is arranged substantially parallel to a second resistor pattern for forming the other of said load resistor elements.

6. The device of claim 5, wherein each of said first and second resistor patterns has a straight figure along their parallel arrangement.

7. The device of claim 1, wherein said memory device has a pair of data lines and a word line for each memory cell, and each of said memory cells includes:
a first transfer-gate transistor coupled between one of said data lines and said first drain area, said first transfer-gate transistor being arranged along the running direction of said one data line; and
a second transfer-gate transistor coupled between the other of said data lines and said second drain area, said second transfer-gate transistor being arranged along the running direction of said other data line, and wherein a gate electrode of each of said first and second transfer-gate transistors is formed by a wiring pattern coupled to said word line.

8. The device of claim 7, wherein both said wiring pattern and said word line are made of a polysilicon, and said word line is formed over said wiring pattern.

9. The device of claim 2, wherein said memory device has a pair of data lines and a word line for each memory cell, and each of said memory cells includes:
a first transfer-gate transistor coupled between one of said data lines and said first drain area, said first transfer-gate transistor being arranged along the running direction of said one data line; and
a second transfer-gate transistor coupled between the other of said data lines and said second drain area, said second transfer-gate transistor being arranged along the running direction of said other data line, and wherein a gate electrode of each of said first and second transfer-gate transistors is formed by a wiring pattern coupled to said word line.

10. The device of claim 9, wherein both said wiring pattern and said word line are made of a polysilicon, and said word line is formed over said wiring pattern.

11. The device of claim 3, wherein said memory device has a pair of data lines and a word line for each memory cell, and each of said memory cells includes:
a first transfer-gate transistor coupled between one of said data lines and said first drain area, said first transfer-gate transistor being arranged along the running direction of said one data line; and
a second transfer-gate transistor coupled between the other of said data lines and said second drain area, said second transfer-gate transistor being arranged along the running direction of said other data line, and wherein a gate electrode of each of said first and second transfer-gate transistors is formed by a wiring pattern coupled to said word line.

12. The device of claim 11, wherein both said wiring pattern and said word line are made of a polysilicon, and said word line is formed over said wiring pattern.

13. The device of claim 4, wherein said memory device has a pair of data lines and a word line for each memory cell, and each of said memory cells includes:
a first transfer-gate transistor coupled between one of said data lines and said first drain area, said first transfer-gate transistor being arranged along the running direction of said one data line; and
a second transfer-gate transistor coupled between the other of said data lines and said second drain area, said second transfer-gate transistor being arranged along the running direction of said other data line, and wherein a gate electrode of each of said first and second transfer-gate transistors is formed by a wiring pattern coupled to said word line.

14. The device of claim 13, wherein both said wiring pattern and said word line are made of a polysilicon, and said word line is formed over said wiring pattern.

15. The device of claim 1, wherein said substrate has a second conductivity type well and said first and second drain areas are formed in said well.

16. The device of claim 2, wherein said substrate has a second conductivity type well and said first and second drain areas are formed in said well.

17. The device of claim 3, wherein said substrate has a second conductivity type well and said first and second drain areas are formed in said well.

18. The device of claim 4, wherein said substrate has a second conductivity type well and said first and second drain areas are formed in said well.

19. The device of claim 7, wherein said substrate has a second conductivity type well and said first and second drain areas are formed in said well.

20. The device of claim 8, wherein said substrate has a second conductivity type well and said first and second drain areas are formed in said well.

21. The device of claim 5, wherein said first and second resistor patterns are respectively formed over said gate electrode patterns.

22. The device of claim 6, wherein said first and second resistor patterns are respectively formed over said gate electrode patterns.

23. The device of claim 9, wherein said first and second resistor patterns are respectively formed over said gate electrode patterns.

24. The device of claim 10, wherein said first and second resistor patterns are respectively formed over said gate electrode patterns.

25. The device of claim 16, wherein said first and second resistor patterns are respectively formed over said gate electrode patterns.

26. The device of claim 21, wherein said first and second resistor patterns are made of a polysilicon.

27. The device of claim 22, wherein said first and second resistor patterns are made of a polysilicon.

28. The device of claim 23, wherein said first and second resistor patterns are made of a polysilicon.

29. The device of claim 24, wherein said first and second resistor patterns are made of a polysilicon.

30. The device of claim 25, wherein said first and second resistor patterns are made of a polysilicon.

31. The device of claim 3, wherein said source area is coupled to a first power line made of a polysilicon, and said first and second resistor patterns are coupled to a second power line which is formed over said first power line.

32. The device of claim 11, wherein said source area is coupled to a first power line made of a polysilicon, and said first and second resistor patterns are coupled to a second power line which is formed over said first power line.

33. The device of claim 12, wherein said source area is coupled to a first power line made of a polysilicon, and said first and second resistor patterns are coupled to a second power line which is formed over said first power line.

34. The device of claim 17, wherein said source area is coupled to a first power line made of a polysilicon, and said first and second resistor patterns are coupled to a second power line which is formed over said first power line.

* * * * *